United States Patent [19]

Drowley

[11] Patent Number: 4,545,823
[45] Date of Patent: Oct. 8, 1985

[54] GRAIN BOUNDARY CONFINEMENT IN SILICON-ON-INSULATOR FILMS

[75] Inventor: Clifford I. Drowley, Mountain View, Calif.

[73] Assignee: Hewlett-Packard Company, Palo Alto, Calif.

[21] Appl. No.: 551,439

[22] Filed: Nov. 14, 1983

[51] Int. Cl.$^4$ ................... H01L 21/265; C30B 19/00
[52] U.S. Cl. ................... 148/1.5; 29/576 B; 29/582; 148/176; 148/181; 148/187; 148/DIG. 93; 156/612
[58] Field of Search .............. 29/582, 576 B; 148/176, 148/181, 1.5, 187; 156/612

[56] References Cited

U.S. PATENT DOCUMENTS

| | | | |
|---|---|---|---|
| 4,406,709 | 9/1983 | Celler et al. | 148/1.5 |
| 4,431,459 | 2/1984 | Teng | 148/1.5 |
| 4,468,855 | 9/1984 | Sasaki | 29/576 B |

FOREIGN PATENT DOCUMENTS 55-48926  4/1980  Japan ................ 29/576 B

OTHER PUBLICATIONS

Okabayashi et al., Appl. Phys. Letts. 36 (1980) 202.
Tamura et al., Jour. Appl. Phys. 50 (1979) 3783.
Fowler et al., IBM-TDB, 22 (1980) 5473.
"Laser-Induced Lateral Epitaxial Growth of Si Over SiO$_2$", S. Kawamura, J. Sakurai and M. Nakano, pp. 243–244, Extended Abstracts of the Electrochemical Society Spring Meeting, Montreal, Canada, May 1982, vol. 82-1, (Electrochemical Society, Pennington, NJ, 1982).
Appl. Phys. Lett. 40 (12), Jun. 15, 1982, Seeded Oscillatory Growth of Si Over SiO$_2$ by CW Laser Irradiation, G. K. Celler, L. E. Trimble, K. K. Ng, H. J. Leamy, H. Baumgart, Accepted for Publication 3/30/82, pp. 1043–1045.
Use of Selective Annealing for Growing Very Large Grain Silicon on Insulator Films, J. P. Colinge, E. Demoulin, D. Bensahel, G. Auvert, Accepted for Publication 6/8/82, pp. 346–347, Appl. Phys. Lett. 41(4), Aug. 15, 1982.
IEEE Electron Device Letters, vol. EDL-4, No. 4, Apr. 1983, Transistors Made in Single-Crystal SOI Films, J. P. Colinge, E. Demoulin, D. Bensahel, G. Auvert, H. Morel.

*Primary Examiner*—Upendra Roy
*Attorney, Agent, or Firm*—Douglas L. Weller; Cheryl L. Shavers

[57] ABSTRACT

Regular arrays of grain boundary free silicon islands have been produced in a silicon on insulator (SOI) structure by using a pattern antirelfective coating in combination with a laser scanning technique. The antireflective coating pattern is made up of a series of parallel stripes terminating in seeding windows. A laser beam is scanned perpendicular to the stripes and over at least two stripes simultaneously, with the long axis of the beam parallel to the scan direction. Grain boundaries are confined to the region under the antireflective stripes.

14 Claims, 3 Drawing Figures

GRAIN BOUNDARY CONFINEMENT IN SILICON-ON-INSULATOR FILMS

BACKGROUND OF THE INVENTION

This invention relates to a method of growing regular arrays of grain boundary free single crystal silicon islands in a silicon-on-insulator film.

In a standard method for making single crystal silicon islands, a patterned antireflection coating is used to define single crystal island areas. The antireflective coating pattern is made up of a series of stripes which are deposited over a layer of polysilicon. A laser beam is then scanned parallel to the antireflective stripes thereby producing a single crystal silicon island between the antireflective stripes [see e.g., J. P. Colinge, E. Demoulin, D. Bensahel, and G. Auvert, "Use of Selective Annealing for Growing Very Large Grain Silicon-On-Insulator," *Applied Physics Letter*, Vol. 41, No. 14 pp.346–347, August 1982; J. P. Colinge, E. Demoulin, D. Bensahel, G. Auvert, and H. Morel, "Transistors Made in Single-Crystal SOI Films," *IEEE Electron Device Letters*, Vol. EDL-4, No. 4 April 1983]. Other methods for growing single crystal silicon islands in a silicon-on-insulator film are described in an article by G. K. Celler, L. E. Trimble, K. K. Ng, H. J. Leamy and H. Baumgart entitled "Seeded Oscillatory Growth of Si Over SiO$_2$ by CW Laser Irradiation," in *Applied Physics Letter*, Vol. 40, No. 12, June 1983.

One of the drawbacks of the above method is the difficulty of obtaining high quality single crystal silicon near the edges of the beam. In addition, overlapped successive scans can destroy the single crystal produced by the earlier scans causing random nucleation in the overlap region. This random nucleation prevents the making of single crystal silicon regions larger than 30 microns in width.

SUMMARY OF THE INVENTION

In accordance with the illustrated preferred embodiment of the present invention, a method for making a regular array of grain boundary free silicon islands is disclosed. These islands have been grown in a silicon-on-insulator layer by using a patterned antireflective coating in combination with a laser scanning procedure. The antireflective coating pattern is made up of a series of parallel stripes terminating in seeding windows for seeding the crystalline growth of the silicon islands. A laser beam of elliptical cross-section is scanned perpendicular to the stripes, with the long axis of the beam parallel to the scan direction. The beam is stepped between successive scans to advance the single crystal growth along the direction of the antireflection stripes. Grain boundaries are confined to the region under the antireflective stripes.

DETAILED DESCRIPTION OF THE INVENTION

Figure 1A:
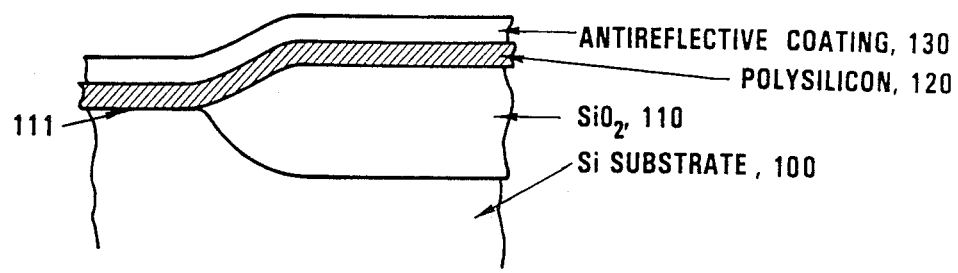
FIG. 1A shows a cross-sectional structure of the preferred embodiment of the present invention.

As illustrated in FIG. 1A, a silicon dioxide layer 110 is formed on the surface of a silicon wafer 100 by conventional oxidation methods. A polysilicon layer 120 is deposited over the silicon dioxide layer 110 by low pressure chemical vapor deposition (LPCVD) techniques. Seed windows 111 connecting the polysilicon to the silicon wafer are provided periodically. For best results the crystal orientation of the edges of the seeding window are in the [110] direction. A capping layer of an antireflective coating 130 is then deposited over the polysilicon layer 120 and seed windows 111, also by LPCVD techniques. The antireflective coating 130 is typically a combination of silicon dioxide and silicon nitride having a total thickness in the range of 750 to 850 angstroms. However, other antireflective coatings can also be used e.g., a single layer of silicon nitride or silicon dioxide.

Figure 1B:
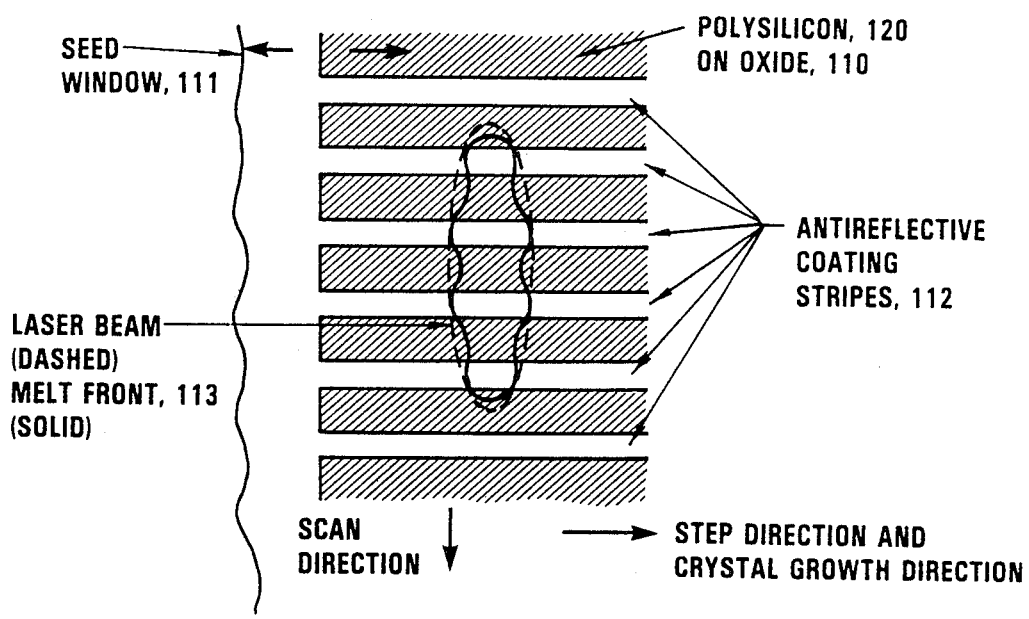
FIG. 1B shows a top view of the preferred embodiment as shown in FIG. 1A of the present invention.

The antireflective coating is then patterned, as shown in FIG. 1B, using a masking step to delineate stripes 112, which in the best mode are generally 10 microns wide and 10 microns apart (center to center). Antireflective stripes having widths in the range of 5 to 25 microns and spacings in the range of 10 to 50 microns can also be used. This masking step thereby defines polysilicon islands between the antireflective coating stripes. An insulating layer, e.g., a layer of silicon dioxide, may be formed between the antireflective stripes. Additionally an inorganic layer, e.g., a layer of silicon nitride, may be formed on top of the insulating layer. The wafer is then processed with a cw argon laser, typically at a scan speed in the range of 10 to 50 centimeters per second, a beam size of typically 50 by 250 microns, an overlap of 90 to 98 percent, and a power ranging from 5 to 15 watts. During laser processing the wafer is kept at a temperature in the range of 350 to 500 degrees celcius. The laser beam is scanned substantially perpendicular to the long axis of the antireflective stripes with the beam spot covering at least two antireflective stripes simultaneously. Each time the beam scans across an island between adjacent antireflective stripes, the silicon which was recrystallized in the previous scan is remelted. New crystallization starts at the center of the island because it is cooler there than at the edges. A melt front 113 is shaped by the antireflective coating to produce concave regions in the space between the stripes and convex regions under the stripes. Defects left from previous scans are eliminated in the remelted silicon by scanning overlaps.

Figure 2:
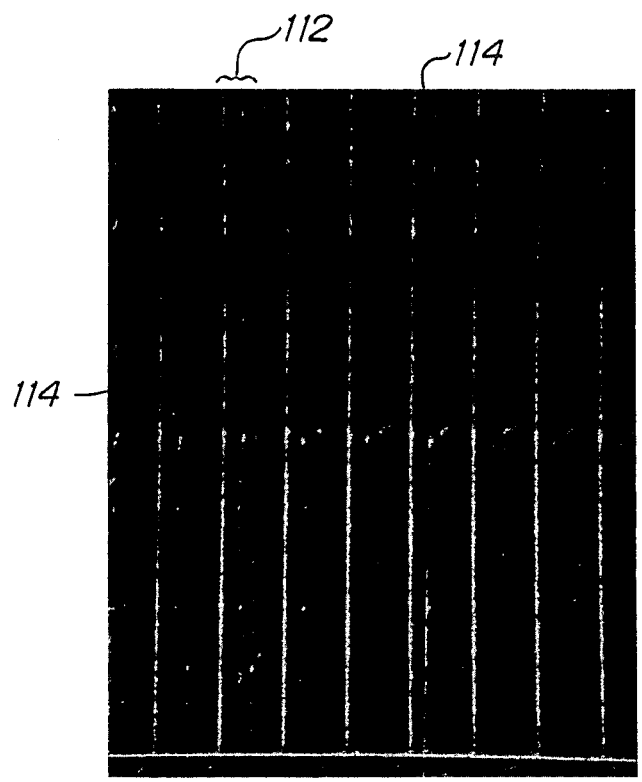
FIG. 2 illustrates a completed array of single crystal stripes according to the preferred embodiment.

After laser processing, long single crystals of silicon are formed in the region between adjacent antireflective coating stripes. The antireflective coating is removed, and the polysilicon surface is decorated with an etch to reveal the grain boundaries. FIG. 2 shows an optical photograph of an array of single silicon crystals grown using the method of the present invention. The grain boundaries 114 are typically straight lines, and are located beneath the center of the antireflective stripes 112.

I claim:

1. In a method for making single crystal silicon islands, the steps comprising:
    forming a first insulating layer over portions of a substrate;
    forming a polysilicon layer over said substrate and said first insulating layer;
    forming an array of antireflective stripes each having a long axis over said polysilicon layer;
    forming a second insulating layer over a region between said antireflective stripes;

forming an inorganic layer over said second insulating layer; and scanning a laser beam perpendicular to said long axis over at least two antireflective stripes simultaneously to form single crystal silicon between said antireflective stripes.

2. A method as in claim 1 wherein said first insulating layer comprises silicon dioxide.

3. A method as in claim 2 wherein said antireflective stripe comprises silicon nitride.

4. A method as in claim 3 wherein said antireflective stripe further comprises silicon dioxide.

5. A method as in claim 4 wherein said second insulating layer comprises silicon dioxide.

6. A method as in claim 5 wherein said inorganic layer comprises silicon nitride.

7. A method as in claim 3 wherein said second insulating layer comprises silicon dioxide.

8. A method as in claim 7 wherein said inorganic layer comprises silicon nitride.

9. A method as in claim 2 wherein said antireflective stripe comprises silicon dioxide.

10. A method as in claim 9 wherein said second insulating layer comprises silicon dioxide.

11. A method as in claim 10 wherein said inorganic layer comprises silicon nitride.

12. A method as in claim 1 wherein said laser beam has an elliptical cross-section.

13. In a method for making single crystal silicon islands, the steps comprising:

forming a first insulating layer over portions of a substrate;

forming a polysilicon layer, a first portion of said polysilicon layer being over said substrate and a second portion of said polysilicon layer being over said first insulating layer;

forming a layer of antireflective material over said first and second portion of said polysilicon layer so that over said second portion of said polysilicon layer there is an array of antireflective stripes each having a long axis; and, scanning a laser beam perpendicular to said long axis over at least two antireflective stripes simultaneously to form single crystal silicon between said antireflective stripes.

14. A method as in claim 13 wherein said laser beam has an elliptical cross-section.

* * * * *